(12) United States Patent
Kim et al.

(10) Patent No.: US 9,721,768 B2
(45) Date of Patent: Aug. 1, 2017

(54) APPARATUS FOR OPTICAL EMISSION SPECTROSCOPY AND PLASMA TREATMENT APPARATUS

(71) Applicant: Samsung Electronics Co., Ltd., Suwon-si, Gyeonggi-do (KR)

(72) Inventors: In-Joong Kim, Seoul (KR); Ilgu Yun, Seoul (KR)

(73) Assignees: SAMSUNG ELECTRONICS CO., LTD. (KR); INDUSTRY-ACADEMIC COOPERATION FOUNDATION, YONSEI UNIVERSITY (KR)

( * ) Notice: Subject to any disclaimer, the term of this patent is extended or adjusted under 35 U.S.C. 154(b) by 55 days.

(21) Appl. No.: 15/089,520

(22) Filed: Apr. 2, 2016

(65) Prior Publication Data

US 2016/0300699 A1  Oct. 13, 2016

(30) Foreign Application Priority Data

Apr. 7, 2015 (KR) .................. 10-2015-0049051

(51) Int. Cl.
*G01J 3/30* (2006.01)
*H01J 37/32* (2006.01)
*G01J 3/443* (2006.01)

(52) U.S. Cl.
CPC ......... *H01J 37/32972* (2013.01); *G01J 3/443* (2013.01); *H01J 37/32917* (2013.01)

(58) Field of Classification Search
CPC ............. G01N 21/645; G01N 21/6428; G01N 21/6452; G01N 2021/6421; G01N 2021/6484; G01J 3/44
See application file for complete search history.

(56) References Cited

U.S. PATENT DOCUMENTS

| 5,654,796 | A | 8/1997 | Mundt | |
| 5,888,337 | A * | 3/1999 | Saito | H01J 37/32935 156/345.25 |
| 5,958,258 | A * | 9/1999 | Ishihara | B24B 37/013 216/60 |
| 6,841,032 | B2 * | 1/2005 | Ikuhara | H01J 37/32935 118/712 |
| 7,453,059 | B2 | 11/2008 | Koo et al. | |
| 7,591,923 | B2 | 9/2009 | Mitrovic et al. | |

(Continued)

FOREIGN PATENT DOCUMENTS

| JP | 2002231639 A | 8/2002 |
| JP | 2006512762 A | 4/2006 |

(Continued)

*Primary Examiner* — Abdullahi Nur
(74) *Attorney, Agent, or Firm* — Renaissance IP Law Group LLP

(57) ABSTRACT

Disclosed is an apparatus for optical emission spectroscopy which includes a light measuring unit measuring light in a process chamber performing a plasma process on a substrate, a light analyzing unit receiving light collected from the light measuring unit to analyze a plasma state, a control unit receiving an output signal of the light analyzing unit to process the output signal, and a light collecting controller disposed between the process chamber and the light measuring unit so as to be combined with the light measuring unit. The light collecting controller controls the light collected to the light measuring unit.

19 Claims, 9 Drawing Sheets

(56) References Cited

U.S. PATENT DOCUMENTS

| | | |
|---|---|---|
| 2004/0008336 A1* | 1/2004 | Lam .................... A61K 48/005 356/72 |
| 2004/0127031 A1 | 7/2004 | Klekotka |
| 2005/0127192 A1 | 6/2005 | Kang et al. |
| 2005/0173375 A1 | 8/2005 | Mitrovic et al. |
| 2006/0290925 A1 | 12/2006 | Nomine et al. |
| 2007/0227231 A1 | 10/2007 | Koo et al. |
| 2014/0022540 A1 | 1/2014 | Asakura et al. |
| 2014/0160477 A1 | 6/2014 | Paradis et al. |

FOREIGN PATENT DOCUMENTS

| | | |
|---|---|---|
| JP | 2006310371 | 11/2006 |
| JP | 2006310371 A | 11/2006 |
| JP | 2013-191875 | 9/2013 |
| JP | 5525087 | 4/2014 |
| KR | 20050053715 A | 6/2005 |
| KR | 20050059451 A | 6/2005 |
| KR | 20080112266 A | 12/2008 |
| KR | 20120118223 A | 10/2012 |
| KR | 20120127350 A | 11/2012 |
| KR | 101247540 A | 3/2013 |
| KR | 20140011996 A | 1/2014 |

* cited by examiner

APPARATUS FOR OPTICAL EMISSION SPECTROSCOPY AND PLASMA TREATMENT APPARATUS

CROSS-REFERENCE TO RELATED APPLICATIONS

A claim for priority under 35 U.S.C. §119 is made to Korean Patent Application No. 10-2015-0049051 filed Apr. 7, 2015, in the Korean Intellectual Property Office, the entire contents of which are hereby incorporated by reference.

BACKGROUND

Embodiments of the inventive concepts described herein relate to an apparatus for optical emission spectroscopy, and more particularly, to an apparatus for optical emission spectroscopy for measuring a plasma state in a process chamber and a plasma treatment apparatus using the same.

As sizes of patterns of semiconductor devices and flat panel display devices have been reduced and manufacturing processes thereof have been advanced, apparatuses for treating a substrate using plasma may have been used in an etching process, a chemical vapor deposition process, and the like. The apparatus for treating a substrate using plasma may apply high frequency energy to a stage or an electrode, thereby generating an electric or magnetic field in a plasma treatment chamber. The substrate may be treated by plasma generated by the electric or magnetic field. In this case, whether to complete the process may be determined by detecting an end point of the process by optical data.

SUMMARY

Embodiments of the inventive concepts may provide an apparatus for optical emission spectroscopy capable of accurately analyzing a plasma state of a local range.

In addition, embodiments of the inventive concepts may also provide an apparatus for optical emission spectroscopy capable of analyzing plasma uniformity in a process chamber.

In one aspect, an apparatus for optical emission spectroscopy may include a light measuring unit measuring light in a process chamber which performs a plasma process on a substrate, a light analyzing unit receiving light collected from the light measuring unit to analyze a plasma state, a control unit receiving an output signal of the optical analyzing unit and processing the output signal, and a light collecting controller disposed between the process chamber and the light measuring unit so as to be combined with the light measuring unit. The light collecting controller may control the light collected from the light measuring unit According to an embodiment, the light collecting controller may control an incident range of the collected light.

According to an embodiment, the light collecting controller may have a cylindrical shape, and an inner diameter of the light collecting controller may be larger than that of the light measuring unit.

According to an embodiment, the apparatus for optical emission spectroscopy may further include a rotating unit rotating the light measuring unit.

According to an embodiment, the light measuring unit may be forcibly inserted to the light collecting controller.

According to an embodiment, one end of the light collecting controller may be forcibly inserted into the light measuring unit.

According to an embodiment, the light collecting controller may include a body surrounding the one end of the light measuring unit, an adjusting unit embedded in the body and controlling the collected light, an elastic member disposed to be adjacent to one end of the adjusting unit disposed in the body, and a adjusting pin adjusting the elastic member to control a position of another end of the adjusting unit from the light measuring unit.

According to an embodiment, the light-collecting controller may further include an aperture disposed therein to control the amount of the light.

According to an embodiment, the light-collecting controller may further include an adjusting pin controlling the aperture to control the amount of the collected light.

According to an embodiment, the light collecting controller may control the amount of the collected light.

In another aspect, a plasma treatment apparatus may include a process chamber having an inner space in which plasma is generated to treat a substrate, the process chamber having a window for monitoring the inner space, and an apparatus for optical emission spectroscopy which measures light in the process chamber to analyze a plasma state in the process chamber. The apparatus for optical emission spectroscopy may include a light measuring unit measuring the light in the process chamber through the window, a light analyzing unit receiving the light collected from the light measuring unit to analyze the plasma state, a control unit receiving an output signal of the light analyzing unit to process the output signal, and a light collecting controller disposed between the process chamber and the light measuring unit so as to be combined with the light measuring unit. The light collecting controller may control the light collected to the light measuring unit.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
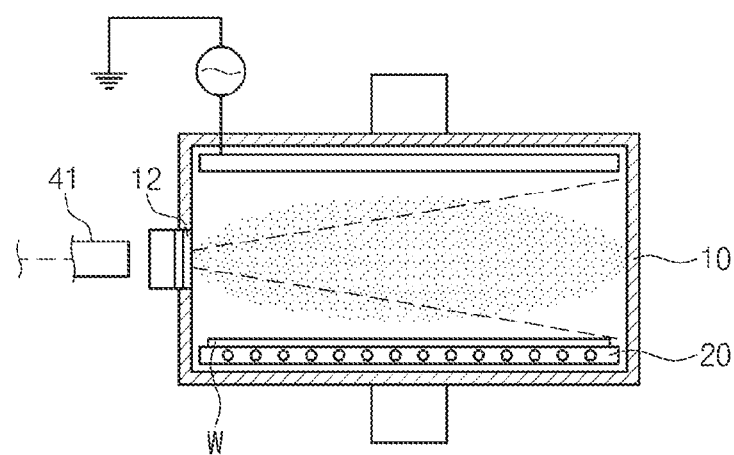
FIG. 1 is a view illustrating an apparatus for optical emission spectroscopy installed to a general process chamber.

Advantages and features of the inventive concept and methods of accomplishing the same reference to the following detailed description of exemplary embodiments and the accompanying drawings may be apparent. However, the invention concept is not limited to the embodiments set forth herein and may be embodied in many different forms, but the embodiment is to complete the disclosure of the inventive concept, and ordinary skill in the art is provided for fully conveying the concept of the invention to those. The inventive concept may be only defined by appended claims. The same reference numerals throughout full specifications may refer to the same elements.

As used herein, the term may be intended to illustrate embodiments, and may be not intended to limit the invention. In this specification, the singular terms "a", "an" and "the" are intended to include the plural forms as well, unless the context clearly indicates otherwise. In addition, the terms "includes", "comprises", "including" and/or "comprising" used in the description may not exclude mentioned components, steps, operation and/or elements of one or more other components, steps, operation and/or presence or addition of elements.

Furthermore, embodiments described herein in this specification may be described with reference to ideal cross-sectional views and/or plan views according to the inventive concept. In the drawings, the thickness of layers and regions may be exaggerated for effective description of the technical contents. Therefore, forms of illustration views may be modified by manufacturing techniques and/or tolerances and the like.

An apparatus for optical emission spectroscopy according to embodiments of the inventive concepts may measure a plasma state of a process chamber by means of an optical emission spectroscopy (OES) corresponding to an optical diagnostic technique of a semiconductor plasma process. For example, a substrate W may be a semiconductor substrate for fabricating a semiconductor device, a glass substrate for fabricating a flat panel display device, or the like. However, the scopes and spirits of the inventive concept are not limited thereto. For example, a process for treating the substrate W may be an etching process, a chemical vapor deposition process, an aching process, a cleaning process, or the like. However, the scope and spirit of the inventive concept are not limited thereto.

Plasma properties (e.g., electron density and ion density) in a chamber may be factors affecting process rate, homogeneity, uniformity and wafer-to-wafer repeatability of a plasma treating process. For example, the electron density in a plasma process chamber may affect degrees of excitation, ionization and dissociation of electrons. Therefore, to perform effectively a process for treating a substrate using plasma, it may be important to monitor a state in the plasma process chamber and to identify a plasma state.

There may be a method for measuring the plasma density through a plasma density measurement sensor (e.g., a Langmuir probe) as a method for obtaining characteristic variables of the plasma state. In a method of measuring plasma characteristics using the Langmuir probe, a metal probe may be inserted into a chamber having plasma and a current variation may be measured by applying a power voltage to the metal probe, thereby determining the electron density of the plasma.

In this contact-type measurement method, the characteristics (e.g., the plasma density) may not be measured in real time by inserting the metal proble into the chamber as needed. In addition, since the Langmuir probe is in direct contact with the plasma in the chamber to analyze the plasma state, the probe may be contaminated and damaged according to an atmosphere of the chamber, thereby causing various problems. For example, impurities may flow into the chamber when the probe is introduced into the chamber.

Figure 2:
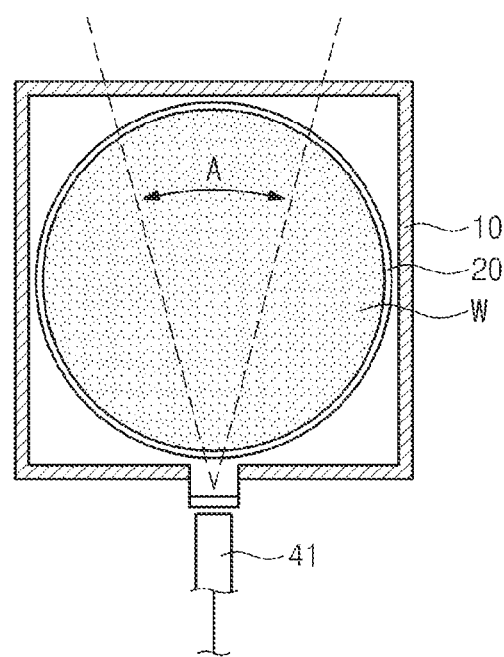
FIG. 2 is a plain view schematically illustrating the apparatus for optical emission spectroscopy in FIG. 1.

FIG. 1 is a view illustrating an apparatus for optical emission spectroscopy installed to a general process chamber 10, and FIG. 2 is a plain view schematically illustrating the apparatus for optical emission spectroscopy installed to the general process chamber 10. Referring to FIGS. 1 and 2, in an optical emission spectroscopy (OES) corresponding to a technique for an optical diagnosis of a semiconductor plasma process, a light incident angular range A of an optical fiber 41 may be limited in a range of about 30° to about 40°, and a plasma state may be measured in an area of about 40% to about 60% of a 12-inch substrate W. Therefore, it may be difficult to measure plasma uniformity in a process chamber 10, and it may be difficult to accurately detect a plasma abnormality that occurred on a portion of the substrate W.

Figure 3:
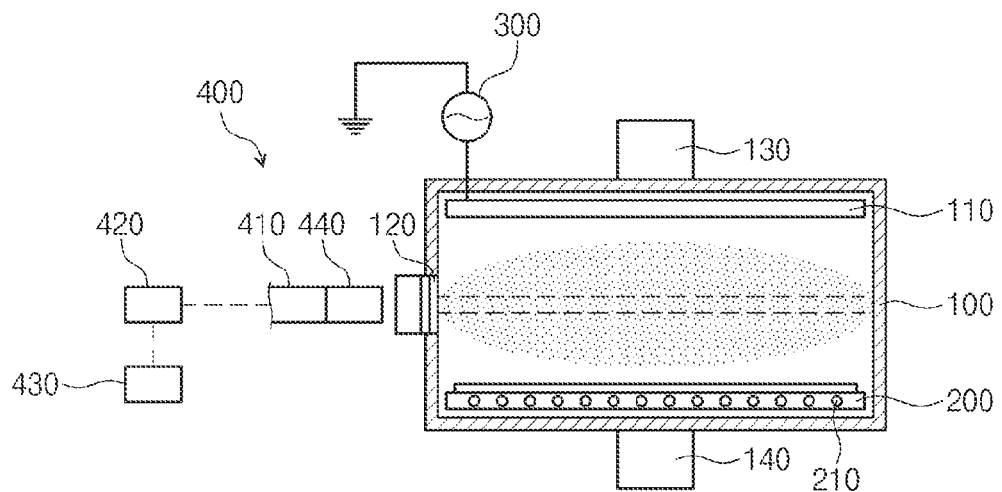
FIG. 3 is a view schematically illustrating a plasma treatment apparatus according to an embodiment of the inventive concept.
Figure 4:
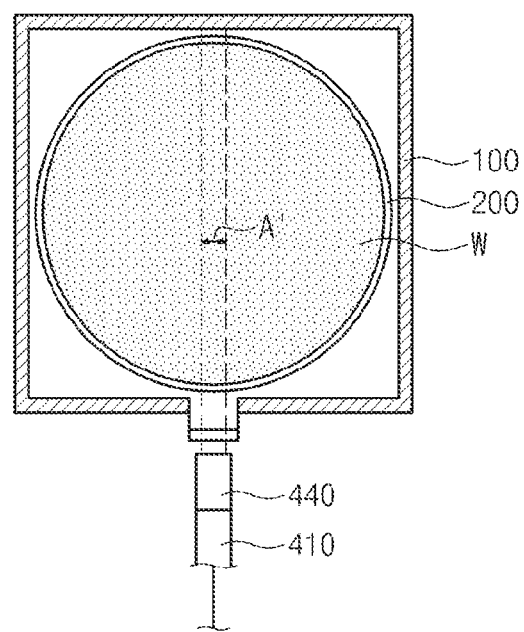
FIG. 4 is a plan view schematically illustrating an apparatus for optical emission spectroscopy of FIG. 3.

FIG. 3 is a view schematically illustrating a plasma treatment apparatus 1 according to an embodiment of the inventive concept. FIG. 4 is a plan view schematically illustrating an apparatus 400 for optical emission spectroscopy of FIG. 3. The plasma treatment apparatus 1 may be provided as a capacitive coupled plasma (CCP) apparatus, an inductive coupled plasma (ICP) apparatus, a microwave plasma apparatus, or other various apparatuses for treating a substrate using plasma. Referring to FIGS. 3 and 4, the plasma treatment apparatus 1 according to an embodiment of the inventive concepts may include a process chamber 100, a stage 200, a radio frequency (RF) power source 300, and an apparatus 400 for optical emission spectroscopy.

The process chamber 100 (hereinafter, referring to as a 'chamber') may have an inner space in which a process of treating a substrate W is performed. In the inner space, plasma may be generated and the substrate W may be treated by the plasma. The chamber 100 may have a sealed structure to maintain a vacuum. For example, the chamber 100 may have a hollow hexahedron, a hollow cylinder, or another shape.

The chamber 100 may include a shower head 110, a window 120, a gas supply port 130, and a gas outlet 140. The shower head 110 may be located in the inner space of the chamber 100. For example, as illustrated in FIG. 3, the shower head 110 may be provided in an upper portion of the inner space of the chamber 100. The shower head 110 may uniformly provide a process gas to the substrate W. The shower head 110 may function as an upper electrode 110. The upper electrode 110 may be disposed to face the stage 200. The window 120 may be provided in one sidewall of the chamber 100. The window 120 may be formed of a glass or quartz. The window 120 may transmit infrared light, ultraviolet light, or light of a visible light band. An opening in which the window 120 is provided may be sealed such that impurities do not flow into the chamber 100 and the vacuum state of the chamber 100 is maintained. In an embodiment, the window 120 may be replaced with another material capable of transmitting light. As described above, the window 120 may be disposed in one sidewall of the chamber 100. However, the inventive concepts are not limited thereto. In an embodiment, the window 120 may be disposed in a top plate of the chamber 100 or an exhaust part of the chamber 100. In addition, the window 120 may be provided in plurality in the chamber 100. The window 120 may be coated with a non-reflecting layer, and a transmittance of the window 120 may be constant according to a wavelength of light.

The gas supply port 130 may be connected to a sidewall or the top plate of the chamber 100. A process gas for treating the substrate W may be supplied through the gas supply port 130. The gas outlet 140 may be connected to a bottom plate or lower portion of a sidewall of the chamber 100. An unreacted source gas and by-products generated in the process of treating the substrate W may be discharged through the gas outlet 140.

The stage 200 may be provided in the inner space of the chamber 110 and may support the substrate W. The stage 200 may be provided on an inner bottom surface of the chamber 100. The stage 200 may have a flat-plate shape. In an embodiment, the stage 200 may have an electrostatic chuck holding the substrate W by electrostatic force. In an embodiment, the stage 200 may include a heater 210 for heating the substrate W to a temperature suitable for a plasma treatment. The heater 210 may be a heating coil embedded in the stage 200.

The RF power source 300 may be provided to apply a radio frequency (RF) power for generating or controlling plasma to the upper electrode 110. One or more RF power sources 300 may be provided in the apparatus 1. Optionally, the RF power source 300 may apply the RF power to another portion of the apparatus 1 as well as the upper electrode 110. In an embodiment, the RF power source 300 may apply the RF power to a lower electrode of the stage 200 when the lower electrode is embedded within a stage 200.

When high frequency energy is applied into the chamber 100 by the RF power source 300, an electric field may be generated between the stage 200 and the upper electrode 110 by a potential difference between the stage 200 and the upper electrode 110, thereby generating the plasma in the chamber 100. A density of the plasma generated on the substrate W may be varied according to the potential difference between the stage 200 and the upper electrode 110. The RF power of the RF power source 300 may be adjusted to control a plasma state of the chamber 100.

The apparatus 400 for optical emission spectroscopy may measure light in the chamber 100 and may monitor the plasma state of the chamber 100. The apparatus 400 for optical emission spectroscopy may collect the light in the chamber 100 and may analyze the plasma state in the chamber 100 by the optical emission spectroscopy (OES). Since the plasma state of the inside of the chamber 100 is analyzed at the outside of the chamber 100, the inside and the process environment of the chamber 100 may be not affected.

The apparatus 400 for optical emission spectroscopy may be installed to be adjacent to an outer sidewall of the chamber 100. The apparatus 400 for optical emission spectroscopy may be installed to be adjacent to a window 120. The apparatus 400 for optical emission spectroscopy may collect light of a region between the stage 200 and the upper electrode 110 through the window 120.

Referring to FIGS. 3 and 4 again, the apparatus 400 for optical emission spectroscopy may include a light measuring unit 410, a light analyzing unit 420, a control unit 430, and a light collecting controller 440. The light measuring unit 410 may measure the light in the chamber 100. The light measuring unit 410 may include an optic fiber. The light measuring unit 410 may collect the light and may transfer the collected light into the light analyzing unit 420. The light analyzing unit 420 may analyze the light provided through the light measuring unit 410 to analyze the plasma state in the chamber 100. The light analyzing unit 420 may split the light, provided through the light measuring unit 410, based on a wavelength and may measure intensity of the light based on the wavelength. The light analyzing unit 420 may transfer an output signal, obtained by analyzing the plasma state, to the control unit 430. The control unit 430 may receive and process the output signal. The control unit 430 may control the light measuring unit 410, the light analyzing unit 420, and the light collecting controller 440. The light collecting controller 440 may be provided between the light measuring unit 410 and the chamber 100. The light collecting controller 440 may control the light collected to the light measuring unit 410. For example, the light collecting controller 440 may control an incident range A' of the light collected to the light measuring unit 410. The light collecting controller 440 may narrow the incident range A' of the collected light to accurately analyze a local range in the chamber 100. For example, the light collecting controller 440 may be controlled to receive only light corresponding to an area less than 10% of an entire area of the substrate W. In an embodiment, the light collecting controller 440 may control the amount of the light collected to the light measuring unit 410. The light collecting controller 440 may control a light collecting time to control the amount of the collected light. Accordingly, it may be possible to accurately analyze the local range in the chamber 100. The light collecting controller 440 may have a body tube shape or a lens barrel shape.

Figure 5:
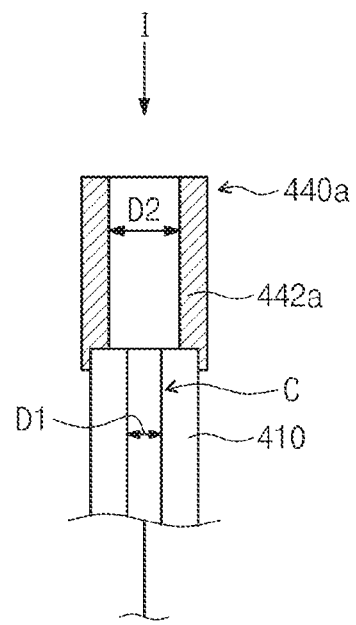
FIG. 5 is a cross-sectional view illustrating an embodiment of a light-collecting controller of FIG. 4.
Figure 6:
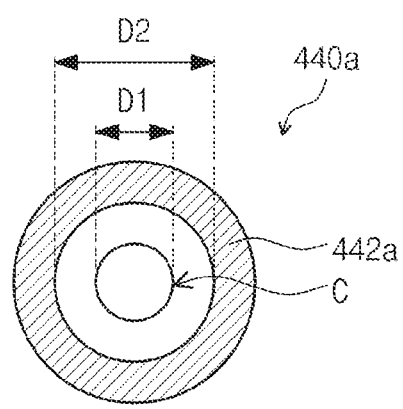
FIG. 6 is a view as shown from a direction T of FIG. 5.

FIG. 5 is a cross-sectional view illustrating an embodiment of a light-collecting controller 440a of FIG. 4. FIG. 6 is a view as shown from a direction T of FIG. 5. Referring to FIGS. 5 and 6, a light measuring unit 410 may include a core C receiving the collected light. The core C may have a first inner diameter D1. The first inner diameter D1 may be varied according to a size and a kind of the core C. A light collecting controller 440a may have a cylindrical shape. The light collecting controller 440a may be provided to enable coupling with the light measuring unit 410. The light collecting controller 440a may have a size corresponding to the light measuring unit 410. In an embodiment, the size of the light collecting controller 440a may be larger than that of the light measuring unit 410. The light measuring unit 410 may have a structure that may be forcibly inserted into one end of the light collecting controller 440a. In an embodiment, an additional detachable member may be provided at one end of the light measuring unit 410 and one end of the light collecting controller 440a. The light collecting controller 440a may have an adjusting unit 442a. The adjusting unit 442a may control the collected light which is received. The adjusting unit 442a may control an incident range and/or the amount of the collected light. The adjusting unit 442a may have a second inner diameter D2. The second inner diameter D2 may be larger than the first inner diameter D1.

Figure 7:
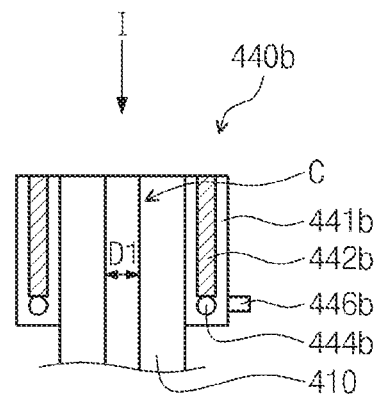
FIGS. 7 and 8 are cross-sectional views illustrating an embodiment of a light-collecting controller of FIG. 4.
Figure 8:
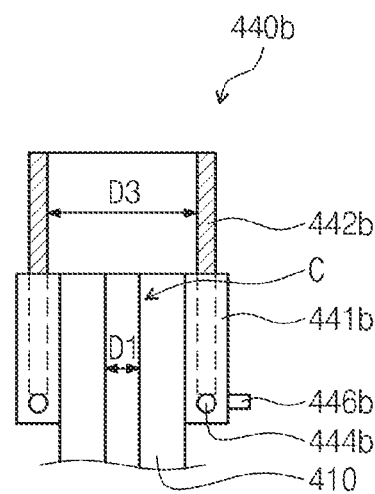

FIGS. 7 and 8 are cross-sectional views illustrating an embodiment of a light-collecting controller 440b of FIG. 4. Referring to FIGS. 7 and 8, a light measuring unit 410 may include a core C receiving the collected light. The core C may have a first inner diameter D1. The first inner diameter D1 may be varied according to a size and a kind of the core C. The light collecting controller 440b may have a cylindrical shape. The light collecting controller 440b may be provided to enable coupling with the light measuring unit 410. One end of the light measuring unit 410 may be embedded in the light collecting controller 440b. The light collecting controller 440b may include a body 441b, an adjusting unit 442b, an adjusting pin 444b, and an elastic member 446b. The body 441b may be provided to surround one end of the light measuring unit 410. The body 441b may be a rigid body. The adjusting unit 442b may be embedded in the body 441b. The adjusting unit 442b may control an incident range and/or the amount of the collected light. A protrusion degree of the adjusting unit 442b protruding from one end of the light measuring unit 410 may be adjusted to control the collected light. The adjusting unit 442b may have a third inner diameter D3. The third inner diameter D3 of the adjusting unit 442b may be larger than the first inner diameter D1 of the core C. The elastic member 446b may be provided to be adjacent to one end of the adjusting unit 442b disposed in the body 441b. The elastic member 446b may be formed of a material having elasticity, e.g., rubber. The adjusting pin 444b may control the elastic member 446b to control the position of the adjusting unit 442b. The adjusting pin 444b may control the protrusion degree of the adjusting unit 442b protruding from one end of the light measuring unit 410. For example, the adjusting pin 444b may move the adjusting unit 442b between a standby position and a processing position. The standby position may correspond to a position at which the adjusting unit 442b is disposed in the light measuring unit 410, as illustrated in FIG. 7. At the standby position, the light measuring unit 410 may analyze an average plasma state with respect to a broad region of a top surface of the substrate W. The processing position may correspond to a position at which the adjusting unit 442b is located at the outside of the light measuring unit 410 to control the amount of the light, as illustrated in FIG. 8. At the processing position, the light measuring unit 410 may be capable of accurate analysis on a local range on the substrate W. The adjusting unit 422b may be located in the light measuring unit 410, so an entire area of the light collecting controller 440b may be reduced and a space utilization of the light collecting controller 440b may be facilitated. In an embodiment, the adjusting pin 444b may gradually move the adjusting unit 442b between the standby position and the processing position.

Figure 9:
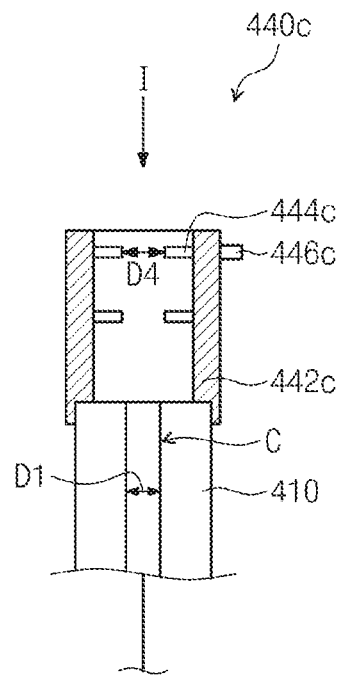
FIGS. 9 and 11 are cross-sectional views illustrating embodiments of a light-collecting controller of FIG. 4.
Figure 10:
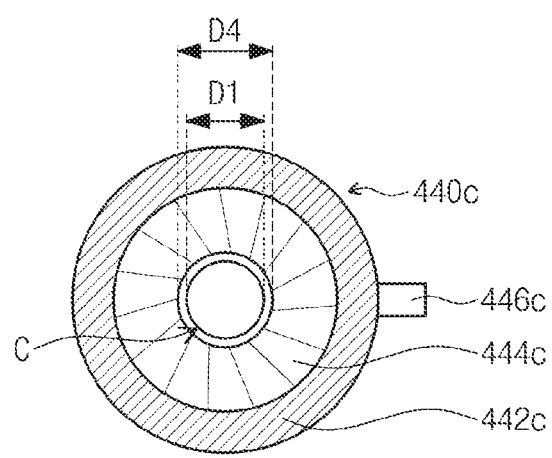
FIGS. 10 and 12 are views as shown from directions 'I' of FIGS. 9 and 11, respectively.
Figure 11:
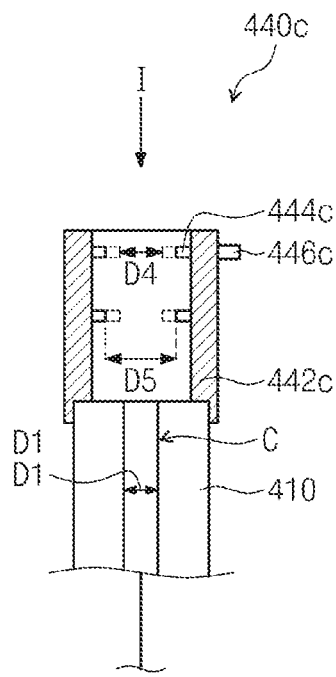
Figure 12:
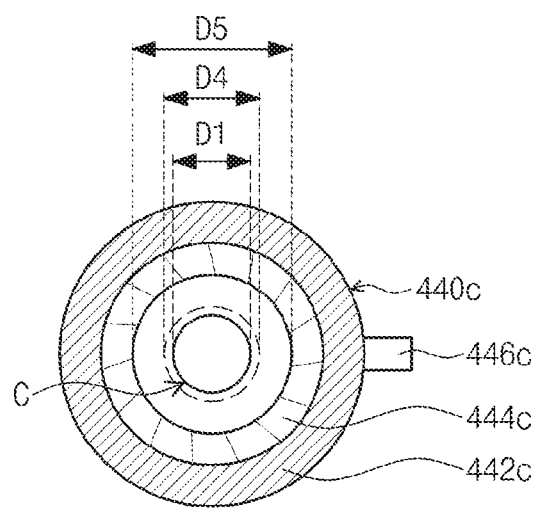

FIGS. 9 and 11 are cross-sectional views illustrating embodiments of a light-collecting controller 440c of FIG. 4. FIGS. 10 and 12 are views as shown from directions 'I' of FIGS. 9 and 11, respectively. Referring to FIGS. 9 to 12, a light measuring unit 410 may have a core C receiving the collected light. The core C may have a first inner diameter D1. The first inner diameter D1 may be varied according to a size and a kind of the core C. A light collecting controller 440c may have a cylindrical shape. The light collecting controller 440c may be provided to enable coupling with the light measuring unit 410. The light collecting controller 440c may have a size corresponding to the light measuring unit 410. In an embodiment, the size of the light collecting controller 440c may be larger than that of the light measuring unit 410. The light measuring unit 410 may have a structure that is forcibly inserted in one end of the light collecting controller 440c. In an embodiment, an additional detachable member may be provided at one end of the light measuring unit 410 and one end of the light collecting controller 440c. The light collecting controller 440c may include an adjusting unit 442c, an aperture 444c, and an adjusting pin 446c. The aperture 444c may be provided in the adjusting unit 442c. The aperture 444c may be provided in plurality along a longitudinal direction of the adjusting unit 442c. In this case, the plurality of apertures 444c may be controlled independently of each other. The aperture 444c may control an incident range and/or the amount of the collected light. For example, the aperture 444c may have an inner diameter ranging from a fourth inner diameter D4 to a fifth inner diameter D5. The fourth inner diameter D4 may be the inner diameter of the aperture 444c when the aperture 444c receives the least amount of light. The fifth inner diameter D5 may be the inner diameter of the aperture 444c when the aperture 444c receives the most amount of light. Referring to FIGS. 9 to 12, each of the fourth and fifth inner diameters D4 and D5 of the aperture 444c may be larger than the first inner diameter D1. The adjusting pin 446c may adjust a width of the aperture 444c to control the amount of the collected light. For example, the adjusting pin 446c may control the aperture 444c such that the aperture 444c has the inner diameter ranging from the fourth inner diameter D4 to the fifth inner diameter D5.

Figure 13:
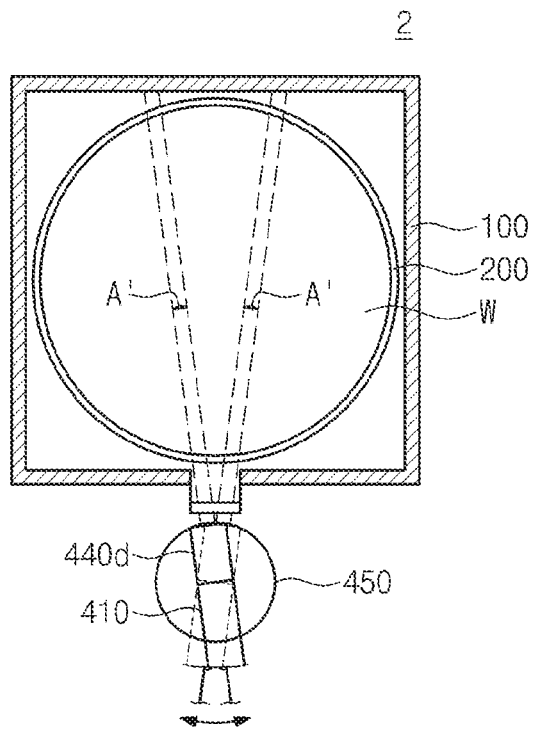
FIG. 13 is a view illustrating a plasma treatment apparatus according to an embodiment of the inventive concept.

FIG. 13 is a view illustrating a plasma treatment apparatus 2 according to an embodiment of the inventive concept. A shape and a function of the plasma treatment apparatus 2 of FIG. 13 may be substantially the same as or similar to those of the plasma treatment apparatus 1 of FIG. 3. However, the plasma treatment apparatus 2 of FIG. 13 may further include a rotating unit 450 in comparison with the plasma treatment apparatus 1 of FIG. 3. The rotating unit 450 may be coupled to the light measuring unit 410. The rotating unit 450 may rotate the light measuring unit 410. Due to the rotating unit 450, the light measuring unit 410 may measure light of various angles through a window 120. Accordingly, plasma in the chamber 100 may be analyzed in a variety of range.

Figure 14:
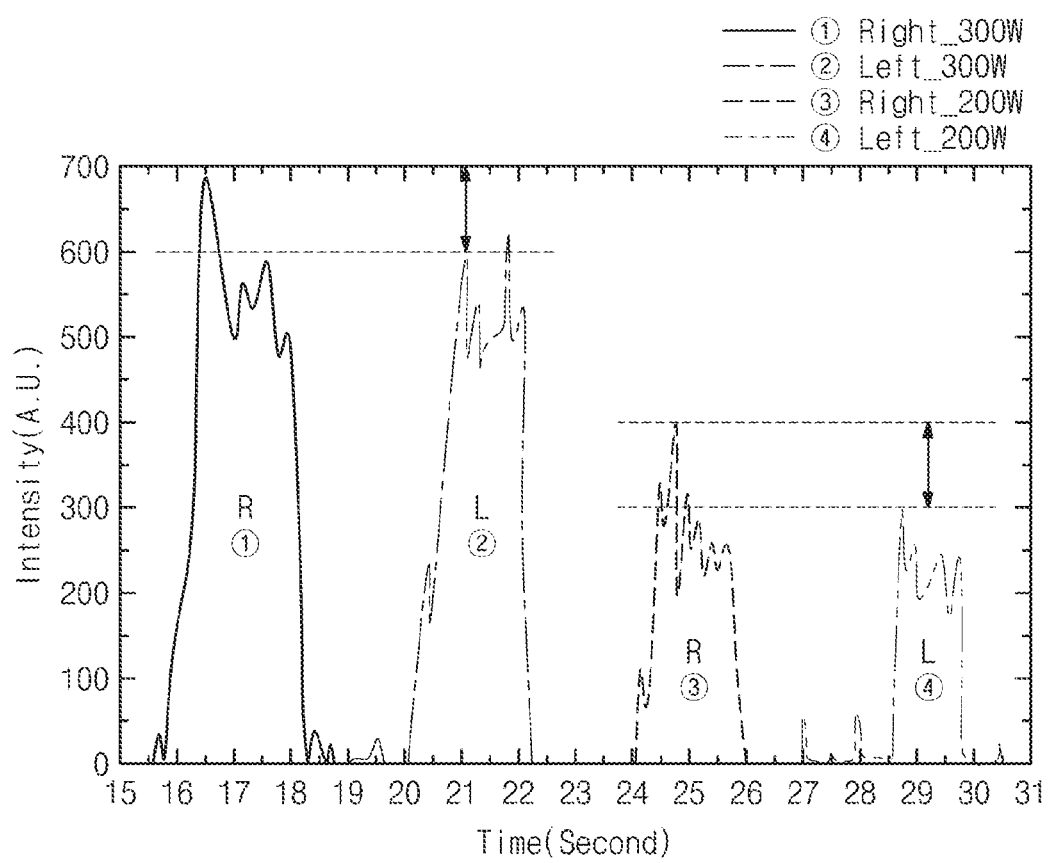
FIG. 14 is a graph illustrating optical-spectroscopic analysis results obtained using the plasma treatment apparatus of FIG. 13.

FIG. 14 is a graph illustrating optical-spectroscopic analysis results obtained using the plasma treatment apparatus of FIG. 13. Reference designators ① and ② are graphs respectively illustrating analyzed light intensities of a right side ① and a left side ② of the substrate W when applying 300W to the RF power source 300. Reference designators ③ and ④ are graphs respectively illustrating analyzed light intensities of a right side ③ and a left side ④ of the substrate W when applying 200W to the RF power source 300. When the graphs ① and ② are compared with the graphs ③ and ④, respectively, the light intensities of the right sides ① and ③ of the substrate W may be about 100 [A.U] larger than those of the left sides ② and ④ of the substrate W. As such, the rotating unit 450 may control the position of the light measuring unit 410, thereby making it possible to identify whether an abnormal state is generated in the chamber 100 or not or whether non-uniformity plasma occurs or not in the chamber 100. In addition, a user may directly set a local range in the chamber 100, thereby making it possible to dynamically identify whether to be an abnormal state of the plasma and a position of the abnormal state.

Figure 15:
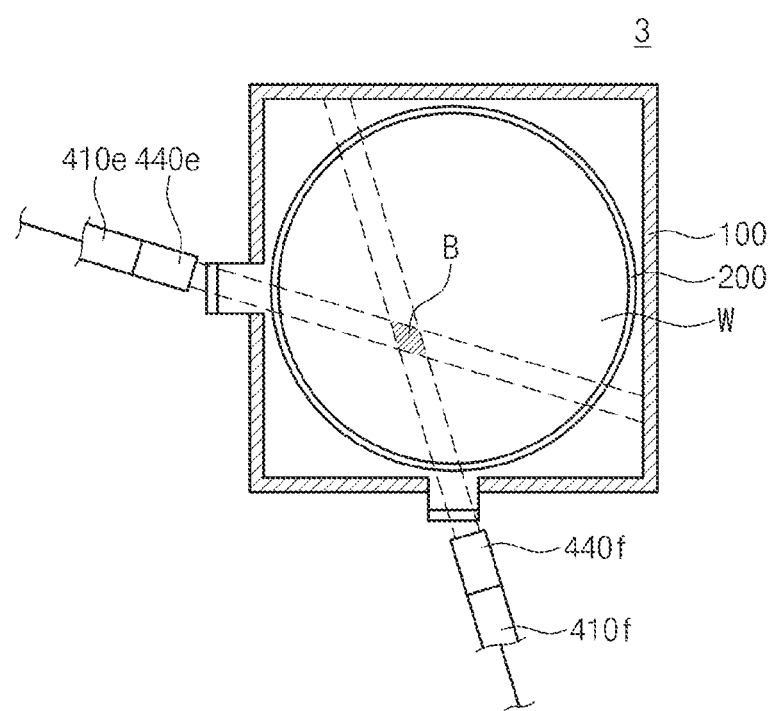
FIG. 15 is a view illustrating a plasma treatment apparatus according to an embodiment of the inventive concept.

FIG. 15 is a view illustrating a plasma treatment apparatus 3 according to an embodiment of the inventive concept. A shape and a function of the plasma treatment apparatus 3 of FIG. 15 may be substantially the same as or similar to those of the plasma treatment apparatus 1 of FIG. 3. However, the plasma treatment apparatus 3 of FIG. 15 may include a plurality of light measuring instruments 410e and 410f, and a plurality of light collecting controllers 440e and 440f. The plurality of light measuring instruments 410e and 410f may be provided at different positions in the plasma treatment apparatus 3. The light measuring instruments 410e and 410f may be combined with the light collecting controllers 440e and 440f, respectively. The plurality of light measuring instruments 410e and 410f may be located to correspond to windows disposed at different positions in the process chamber 100. Accordingly, it is possible to perform a space analysis of a crossing region B of light receiving ranges of the light measuring instruments 410e and 410f.

The apparatus for optical emission spectroscopy according to the above embodiments of the inventive concepts may have advanced scalability and convenience easily attachable to the general plasma equipment. The apparatus for optical emission spectroscopy may detect an abnormal state of the plasma in advance to reduce scrap or disuse of a wafer. Thus, it is possible to contribute to a production cost reduction. In addition, the apparatus for optical emission spectroscopy according to embodiments of the inventive concept may analyze the plasma state on all light of the plasma affecting a wafer. Furthermore, the apparatus for optical emission spectroscopy according to the embodiments may be widely used without affecting a setting signal of the conventional end point detection (EPD).

An embodiment of the inventive concept may provide the apparatus for optical emission spectroscopy, which is capable of accurately analyzing a plasma state of a local range.

In addition, an embodiment of the inventive concept may provide the apparatus for optical emission spectroscopy, which is capable of analyzing the plasma uniformity in a process chamber.

The effects of the inventive concept may be not limited to above-mentioned effects. Effects which are not mentioned will be clearly understood to those of ordinary skill in the art from the description and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for optical emission spectroscopy, the apparatus comprising:
    a light measuring unit, which measures light in a process chamber that performs a plasma process on a substrate;
    a light analyzing unit, which receives light collected from the light measuring unit to analyze a plasma state;
    a control unit, which receives an output signal of the light analyzing unit to process the output signal; and
    a light collecting controller disposed between the process chamber and the light measuring unit so as to be combined with the light measuring unit, the light collecting controller controlling the light collected to the light measuring unit;
        wherein the light collecting controller controls an incident range of the collected light; and
        wherein the light collecting controller has an inner diameter that is larger than that of an inner diameter of the light measuring unit.

2. The apparatus of claim 1, wherein the light collecting controller has a cylindrical shape.

3. The apparatus of claim 1, further comprising:
    a rotating unit, which rotates the light measuring unit.

4. The apparatus of claim 1, wherein the light measuring unit is inserted into the light collecting controller.

5. The apparatus of claim 1, wherein one end of the light measuring unit is embedded in the light collecting controller.

6. The apparatus of claim 5, wherein the light collecting controller comprises:
    a body surrounding the one end of the light measuring unit;
    an adjusting unit embedded in the body and controlling the collected light;
    an elastic member disposed to be adjacent to one end of the adjusting unit disposed in the body; and
    an adjusting pin adjusting the elastic member to control a position of another end of the adjusting unit from the light measuring unit.

7. The apparatus of claim 1, wherein the light collecting controller further comprises:
    an aperture disposed in the light collecting controller and controlling the collected light.

8. The apparatus of claim 7, wherein the light collecting controller further comprises:
    an adjusting pin controlling the aperture to control the amount of the collected light.

9. The apparatus of claim 1, wherein the light collecting controller controls the amount of the collected light.

10. A plasma treatment apparatus comprising:
    a process chamber having an inner space in which plasma is generated to treat a substrate, the process chamber having a window for monitoring the inner space; and
    an apparatus for optical emission spectroscopy which measures light in the process chamber to analyze a plasma state in the process chamber,
    wherein the apparatus for optical emission spectroscopy comprises:
    a light measuring unit, which measures the light in the process chamber through the window;
    a light analyzing unit, which receives the light collected from the light measuring unit to analyze the plasma state;
    a control unit, which receives an output signal of the light analyzing unit to process the output signal; and
    a light collecting controller disposed between the process chamber and the light measuring unit so as to be combined with the light measuring unit, the light collecting controller controlling the light collected to the light measuring unit;
        wherein the light collecting controller controls an incident range of the collected light; and
        wherein the light collecting controller has an inner diameter that is larger than that of an inner diameter of the light measuring unit.

11. The apparatus of claim 10, wherein the light collecting controller has a cylindrical shape.

12. The plasma treatment apparatus of claim 10, wherein the apparatus for optical emission spectroscopy further comprises:
    a rotating unit, which rotates the light measuring unit.

13. The plasma treatment apparatus of claim 10, wherein the light measuring unit is inserted into the light collecting controller.

14. The plasma treatment apparatus of claim 10, wherein one end of the light measuring unit is embedded in the light collecting controller.

15. An apparatus for optical emission spectroscopy, the apparatus comprising: a light collecting controller; wherein the light collecting controller has an aperture that controls an incident range of the light collected from a window of a process chamber that performs a plasma process on a substrate; a light measuring unit, which measures light received from the light collecting controller; wherein the light collecting controller has one end that is embedded in the light measuring unit; wherein the aperture of the light collecting controller controls an amount of the light that reaches the light measuring unit from the light collecting controller; a light analyzing unit, which receives light from the light measuring unit to analyze a plasma state; and a control unit, which receives an output signal of the light analyzing unit to process the output signal, wherein the light collecting controller has an inner diameter that is larger than that of an inner diameter of the light measuring unit.

16. The apparatus of claim 15, further comprising:
a rotating unit rotating the light measuring unit.

17. The apparatus of claim 15, wherein the light collecting controller comprises:
a body surrounding the one end of the light measuring unit;
an adjusting unit embedded in the body and controlling the collected light;
an elastic member disposed to be adjacent to one end of the adjusting unit disposed in the body; and
an adjusting pin adjusting the elastic member to control a position of another end of the adjusting unit from the light measuring unit.

18. The apparatus of claim 17, wherein the light collecting controller further comprises:
an adjusting pin controlling the aperture to control the amount of the collected light.

19. The apparatus of claim 15, wherein the light collecting controller may be controlled to receive only light from a portion of an entire surface area of a substrate in a process chamber.

\* \* \* \* \*